United States Patent
Oh

(10) Patent No.: US 11,245,041 B2
(45) Date of Patent: Feb. 8, 2022

(54) TFT SUBSTRATE AND LIGHT EMITTING DISPLAY DEVICE INCLUDING THE SAME

(71) Applicant: LG Display Co., Ltd., Seoul (KR)

(72) Inventor: Kum-Mi Oh, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 114 days.

(21) Appl. No.: 16/555,753

(22) Filed: Aug. 29, 2019

(65) Prior Publication Data

US 2020/0091350 A1 Mar. 19, 2020

(30) Foreign Application Priority Data

Sep. 13, 2018 (KR) .......................... 10-2018-0109344

(51) Int. Cl.
| | |
|---|---|
| *H01L 29/786* | (2006.01) |
| *H01L 29/417* | (2006.01) |
| *H01L 27/32* | (2006.01) |
| *H01L 29/423* | (2006.01) |
| *H01L 27/12* | (2006.01) |

(52) U.S. Cl.
CPC .. *H01L 29/78696* (2013.01); *H01L 29/41733* (2013.01); *H01L 29/42384* (2013.01); *H01L 29/78618* (2013.01); *H01L 29/78621* (2013.01); *H01L 29/78672* (2013.01); *H01L 27/1251* (2013.01); *H01L 27/1255* (2013.01); *H01L 29/78633* (2013.01)

(58) Field of Classification Search
CPC .................... H01L 29/78675; H01L 29/78678
See application file for complete search history.

(56) References Cited

U.S. PATENT DOCUMENTS

2016/0189611 A1* 6/2016 Jinta .................... G09G 3/2003
345/690

FOREIGN PATENT DOCUMENTS

KR 10-2017-0124523 A 11/2017

* cited by examiner

*Primary Examiner* — Moazzam Hossain
(74) *Attorney, Agent, or Firm* — Polsinelli PC

(57) ABSTRACT

A thin film transistor (TFT) substrate comprises a TFT located on a substrate and including a gate electrode, a first semiconductor layer and a second semiconductor layer, wherein the first semiconductor layer, the gate electrode and the second semiconductor layer vertically stacked, and the first and second semiconductor layers are made of polycrystalline silicon, and wherein the first and second semiconductor layers are electrically connected to each other in series and respectively include first and second channel portions, and at least one of the first and second channel portions has a bent structure in a plan view.

9 Claims, 7 Drawing Sheets

TFT SUBSTRATE AND LIGHT EMITTING DISPLAY DEVICE INCLUDING THE SAME

CROSS REFERENCE TO RELATED APPLICATION

The present application claims the priority benefit of Korean Patent Application No. 10-2018-0109344 filed in Republic of Korea on Sep. 13, 2018, which is hereby incorporated by reference in its entirety.

BACKGROUND

Field of the Disclosure

The present disclosure relates to a display device, and more particularly, to a thin film transistor (TFT) substrate and a light emitting display device including the same. Although the present disclosure is suitable for a wide scope of applications, it is particularly suitable for providing a TFT substrate and a light emitting display device including the same which can secure a length of a channel of a driving TFT using polycrystalline silicon and achieve a stable driving characteristic.

Description of the Background

Generally, a thin film transistor (TFT) substrate in which TFTs are formed is used for a light emitting display device, including an organic light emitting display device (OLED) as a self-luminescent device.

A TFT uses amorphous silicon or polycrystalline silicon for an active layer thereof. Since polycrystalline silicon is excellent in mobility and the like compared with amorphous silicon, a display device requiring a high performance such as a high resolution uses a TFT substrate including polycrystalline silicon.

A driving TFT in a pixel is an element which is connected to a light emitting diode and drives the light emitting diode, and requires a channel having a length long enough in order to secure a stable driving characteristic.

However, as a resolution of a display device increases, a size of a pixel inevitably decreases. Accordingly, there is a problem that a driving TFT does not have a channel with a long enough length of as required.

SUMMARY

Accordingly, the present disclosure is directed to a TFT substrate and a light emitting display device including the same that substantially obviate one or more of the problems due to limitations and disadvantages of the prior art.

An advantage of the present disclosure is to provide a TFT substrate and a light emitting display device including the same which can secure a length of a channel of a driving TFT using polycrystalline silicon and achieve a stable driving property.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a thin film transistor (TFT) substrate comprises a TFT located on a substrate and including a gate electrode, a first semiconductor layer and a second semiconductor layer, wherein the first semiconductor layer, the gate electrode and the second semiconductor layer vertically stacked, and the first and second semiconductor layers are made of polycrystalline silicon, and wherein the first and second semiconductor layers are electrically connected to each other in series and respectively include first and second channel portions, and at least one of the first and second channel portions has a bent structure in a plan view.

In another aspect of the present disclosure, a display device comprises a thin film transistor (TFT) substrate that has a TFT including a gate electrode, a first semiconductor layer and a second semiconductor layer; a first electrode connected to the TFT; and wherein the first semiconductor layer, the gate electrode and the second semiconductor layer vertically stacked, and the first and second semiconductor layers are made of polycrystalline silicon, and wherein the first and second semiconductor layers are electrically connected to each other in series and respectively include first and second channel portions, and at least one of the first and second channel portions has a bent structure in a plan view.

In a further aspect of the present disclosure, a thin film transistor (TFT) substrate comprises a TFT located on a substrate and including a gate electrode, a first semiconductor layer and a second semiconductor layer, the first semiconductor layer, the gate electrode and the second semiconductor layer vertically stacked, and the first and second semiconductor layers made of polycrystalline silicon, wherein the first and second semiconductor layers are electrically connected in series to each other, and respectively include first and second channel portions, and wherein the first channel portion includes a first channel part extending in a first direction, and a second channel part extending in a second direction different from the first direction, wherein the second channel portion includes a third channel part extending in the first direction and vertically overlapping the first channel part, a fourth channel part extending in a direction different from the second direction, and the first and third channel parts have a same channel length.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Reference will now be made in detail to exemplary aspects, examples of which are illustrated in the accompanying drawings. The same reference numbers may be used throughout the drawings to refer to the same or like parts.

A TFT substrate of aspects of the present disclosure may be applied to all sorts of electronic devices using a TFT. For example, a TFT substrate may be applied to various electronic devices including a display device, a sensor panel, and the like.

For the purpose of explanations, aspects of the present disclosure are described with a TFT substrate used for an organic light emitting display device (OLED) by way of example.

Figure 1:
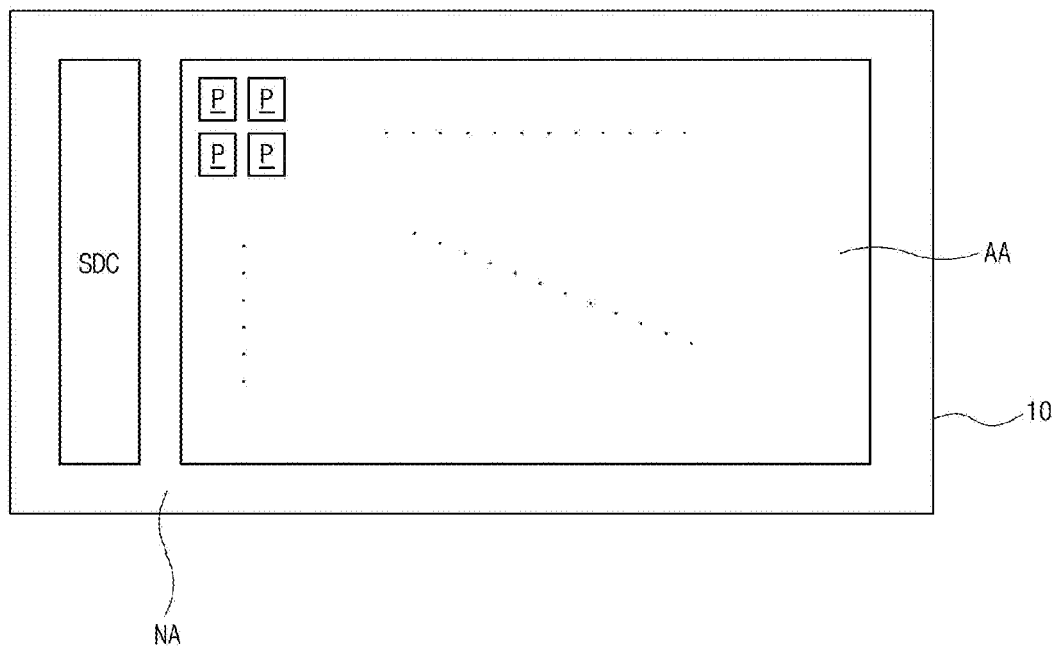
FIG. 1 is a plan view schematically illustrating a TFT substrate of an OLED display device according to the present disclosure.
Figure 2:
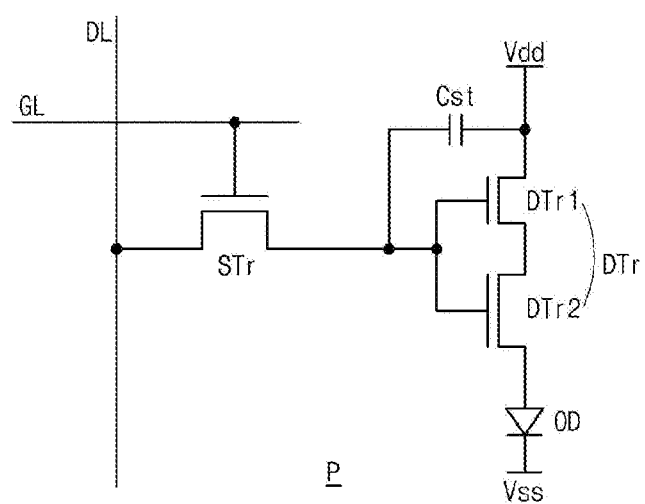
FIG. 2 is a circuit diagram schematically illustrating a pixel region of FIG. 1.

FIG. 1 is a plan view schematically illustrating a TFT substrate of an OLED display device according to the present disclosure. FIG. 2 is a circuit diagram schematically illustrating a pixel region of FIG. 1.

Referring to FIGS. 1 and 2, the TFT 10 may include a display region AA as an active region for displaying an image, and a non-display region NA as a non-active region which is located around (or surrounds) the display region AA The TFT substrate 10 includes array elements to drive the OLED and may be referred to as an array substrate.

In the display region AA, a plurality of pixel regions P may be arranged in a matrix form. The plurality of pixel regions P may include, for example, red, green and blue pixel regions P respectively displaying red, green and blue. The red, green and blue pixel regions P may be located alternately in a direction.

Each pixel region P may include driving elements to operate the pixel region P. For example, a plurality of TFTs and a light emitting diode OP may be formed in the pixel region P.

In the non-display region NA, a driving circuit driving the pixel regions P in the display region AA may be located.

For example, a scan driving circuit SDC which outputs a scan signal such as a gate signal and provides the scan signal to the pixel region P may be located in the non-display region NA. The scan driving circuit SDC may be formed directly in the TFT substrate 10.

The scan driving circuit SDC formed directly in the TFT substrate 10 may be referred to as a GIP (gate in panel) type driving circuit, which may be formed in processes of manufacturing the TFT 10. The GIP type scan driving circuit SDC may include a plurality of TFTs for a driving circuit, and the plurality of TFTs for the driving circuit may have a structure that is the same as or similar to that of the TFTs of the pixel region P.

A structure of the pixel region P is explained in detail with reference to FIGS. 2 and 3. For the purpose of explanations, N (negative) type TFTs are used in the pixel region P by way of example.

In the pixel region P, a plurality of TFTs for a pixel including a switching TFT STr and a driving TFT DTr and a light emitting diode OD as a light emitting element, and a storage capacitor Cst may be formed.

The switching TFT STr may be connected to a gate line GL and a data line DL which cross each other and define the pixel region P. For example, a gate electrode of the switching TFT STr may be connected to the gate line GL, and a drain electrode of the switching TFT STr may be connected to the data line DL.

The switching TFT STr is turned on in response to a gate voltage applied through the gate line GL located at a corresponding row line, and thus a data voltage supplied through the data line DL is applied to the driving TFT DTr.

The driving TFT DTr may be connected to the switching TFT STr and the light emitting diode OD. For example, a gate electrode of the driving TFT DTr may be electrically connected to a source electrode of the switching TFT STr, and a source electrode of the driving TFT DTr may be electrically connected to the light emitting diode OD. A drain electrode of the driving TFT DTr may be configured to receive a first power voltage Vdd. In case that the driving TFT DTr is an N type TFT, the first power voltage Vdd may be a high power voltage Vdd.

A light emitting current applied to the light emitting diode OD may be controlled according to a voltage applied to the gate electrode of the driving TFT DTr.

The light emitting diode OD may be configured as, for example, an organic light emitting diode in which a light emission material layer is made of an organic material. The light emitting diode OD emits a light according to the light emitting current from the driving TFT DTr.

The light emitting diode OD may be configured such that a first electrode thereof, for example, an anode is connected to the source electrode of the driving TFT DTr, and a second electrode thereof, for example, a cathode may be applied with a second power voltage Vss, for example, a low power voltage Vss.

The storage capacitor Cst may be connected to the gate electrode of the driving TFT DTr and serve to maintain the voltage, which is applied to the gate electrode of the driving TFT DTr, until a next frame.

The storage capacitor Cst may be configured such that a first electrode thereof is connected to the gate electrode of the driving TFT DTr, and a second electrode thereof is connected to, for example, the drain electrode (or the source electrode) of the driving TFT DTr.

In the present disclosure, in order to stably secure a length of a channel of the driving TFT DTr, the driving TFT DTr may be configured with two sub-driving TFTs DTr1 and DTr2 which are stacked in a direction vertical to a substrate.

For example, the driving TFT DTr may configure to include a first sub-driving TFT DTr1 located on the substrate, and a second sub-driving TFT DTr2 located on the first sub-driving TFT DTr2. The first and second sub-driving TFTs DTr1 and DTr2 may be connected in serial to each other and share a gate electrode. The first sub-driving TFT DTr1 may be applied with the first power voltage Vdd at its drain electrode, and the second sub-driving TFT DTr2 may be connected to the light emitting diode OD at its source electrode.

Since the driving TFT DTr is configured in a vertically double-stacked structure, a length of a channel of the driving TFT DTr increases in a limited area of the pixel region thus can be secured as required. Accordingly, degradation of a driving property, such as a stability of a drain current being reduced and an off current increasing because of a hot carrier reliability being deteriorated by a short length of a channel, can be improved.

In this disclosure, in addition to an increase of a length of a channel by the vertically stacked structure, at least one sub-driving TFT may be configured such that a channel thereof is formed to extend in two directions in a plan view. Accordingly, a required length of a channel can be satisfied at a minimal area.

In order to increase a length of a channel in a plan view, a channel of at least one sub TFT may be configured to have a bent structure. In other words, a semiconductor layer of at least one sub TFT may be configured to have a bent structure.

The switching TFT STr may be configured to have a single-TFT structure. For example, the switching TFT STr may be formed to have a structure which is the same as or similar to that of the first or second sub-driving TFT DTr1 or DTr2.

Alternatively, the switching TFT STr may be configured to have a double-TFT stacked structure similar to that of the driving TFT DTr.

At least one of TFTs formed in the scan driving circuit SDC may be configured to have a double-TFT stacked structure similar to that of the driving TFT DTr.

Aspects regarding the vertically stacked structure of the driving TFT DTr and the bent structure, in a plan view, of the semiconductor layer are explained below.

Figure 3:
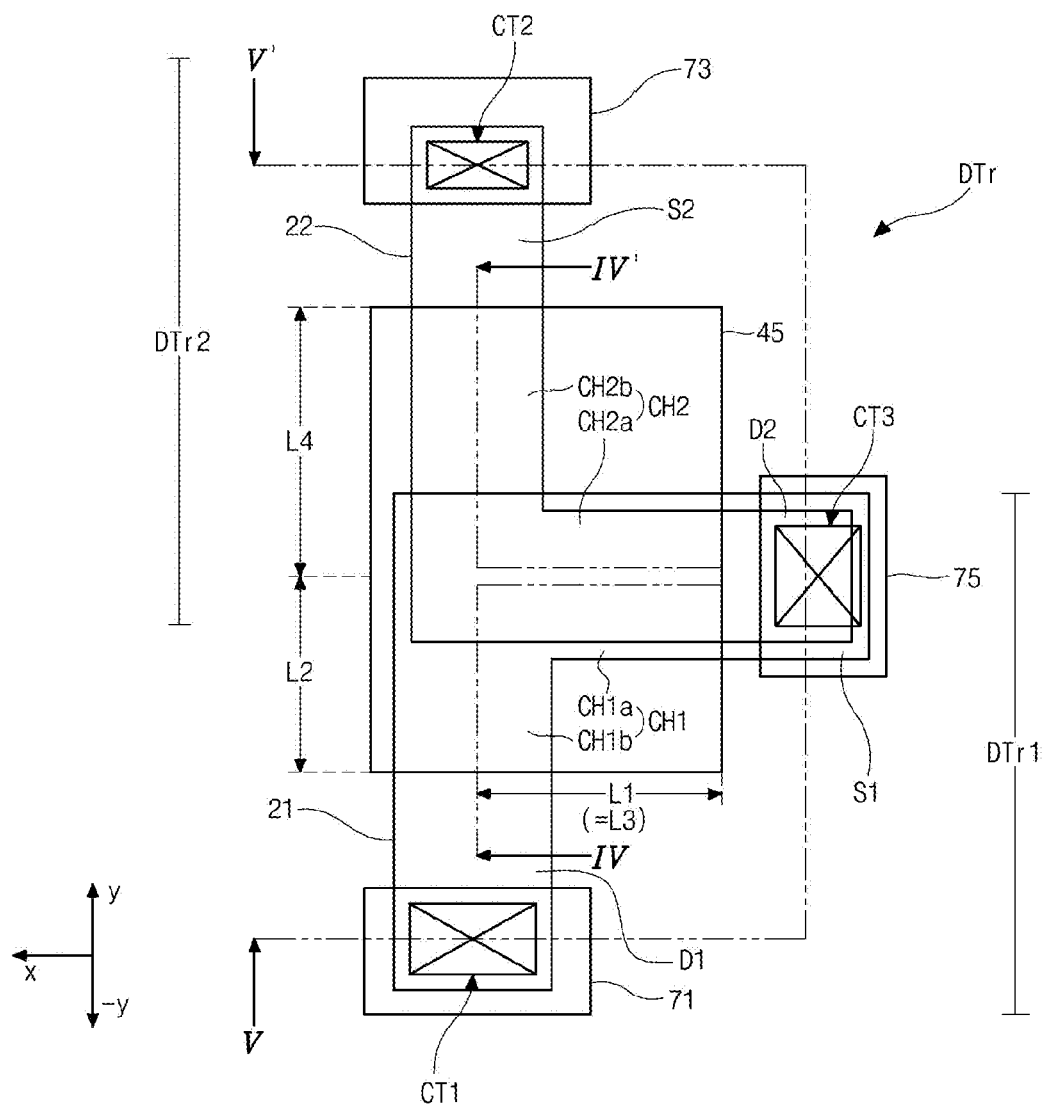
FIG. 3 is a view schematically illustrating a plan structure of a driving TFT in a pixel region according to a first aspect of the present disclosure.
Figure 4:
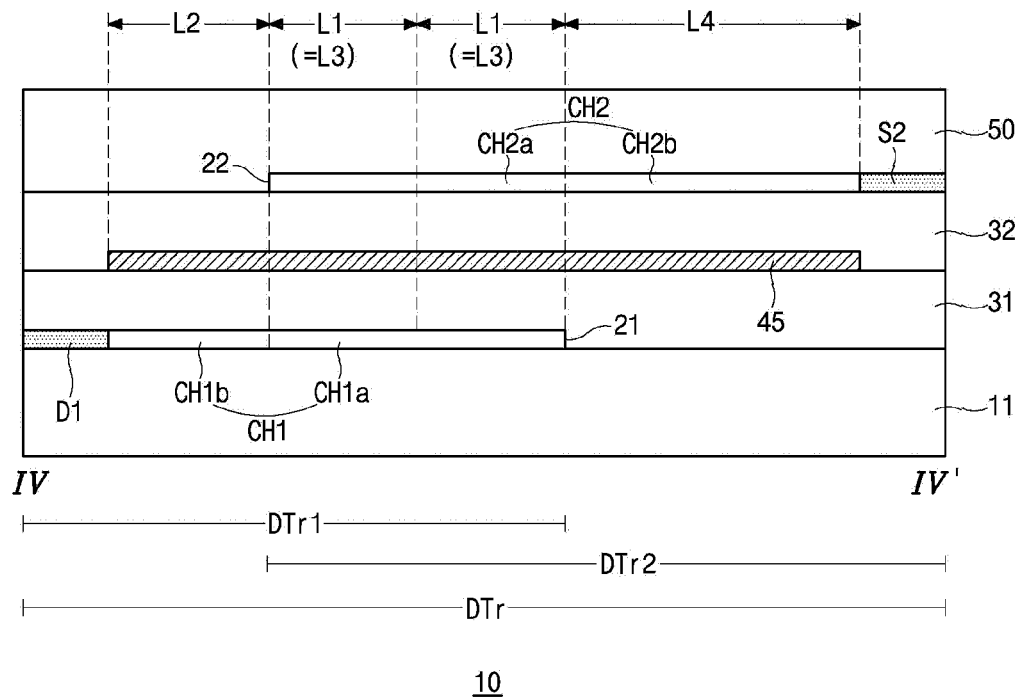
FIG. 4 is a cross-sectional view taken along line IV-IV' of FIG. 3.

FIG. 3 is a view schematically illustrating a plan structure of a driving TFT in a pixel region according to a first aspect of the present disclosure. FIG. 4 is a cross-sectional view taken along line IV-IV' of FIG. 3, and FIG. 5 is a cross-sectional view taken along line V-V' of FIG. 3.

Figure 5:
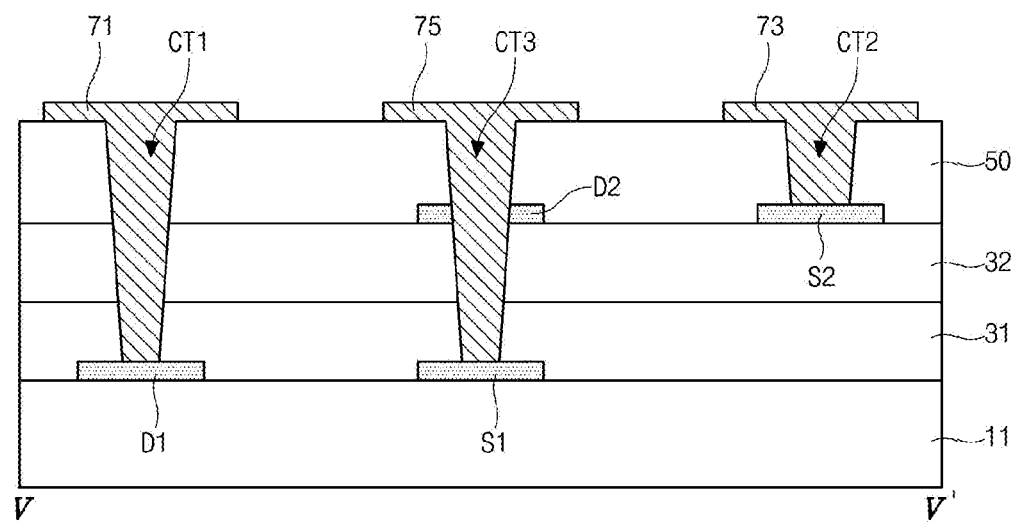
FIG. 5 is a cross-sectional view taken along line V-V' of FIG. 3.

Referring to FIGS. 3 to 5, in the TFT substrate 10, the driving TFT DTr may be configured to have a structure doubly stacked in a direction vertical to a surface of a substrate 11.

For example, the first sub-driving TFT DTr1 as a lower driving TFT may be formed on the substrate 11, and the second sub-driving TFT DTr2 as an upper driving TFT may be formed on the first sub-driving TFT DTr1.

In the vertically stacked structure, a gate electrode 45 may serve as a common gate electrode which is shared by both of the first and second sub-driving TFTs DTr1 and DTr2.

The first and second sub-driving TFTs DTr1 and DTr2 may be connected in series to each other.

The cross-sectional structure of the first and second sub-driving TFTs DTr1 and DTr2 refers to FIG. 4, the first sub-driving TFT DTr1 may have a top gate structure, and the second sub-driving TFT DTr2 may have a bottom gate structure.

In this regard, in each pixel region P, a first semiconductor layer 21 as a semiconductor layer of the first sub-driving TFT DTr may be formed on the substrate 11. The first semiconductor layer 21 may be made of polycrystalline silicon.

A buffer layer may be located below the first semiconductor layer and be formed over the entire surface of the substrate 11.

The first semiconductor layer 21 may include a first channel portion CH1 which is a portion of the first semiconductor layer 21 corresponding to the gate electrode 45 thereon i.e., overlapping the gate electrode 45, and a first source portion S1 and a first drain portion D1 located at both sides of the first channel portion CH1.

The first source portion S1 and the first drain portion D1 are portions highly doped with impurities, for example, an N type or P type dopant. In a doping process of the first source portion S1 and the first drain portion D1, the gate electrode 45 may serve as a doping mask.

A first gate insulating layer 31 as an insulating layer may be formed on the first semiconductor layer 21. The first gate insulating layer 31 may be formed entirely over the substrate 11. The first gate insulating layer 31 may be made of an inorganic insulating material, for example, silicon oxide ($SiO_2$) or silicon nitride ($SiN_X$).

The gate electrode 45 corresponding to the first channel portion CH1 may be formed on the first gate insulating layer 31. The gate electrode 45 may serve as a top gate electrode for the first sub-driving TFT DTr1.

A second gate insulating layer 32 as an insulating layer may be formed on the gate electrode 45. The second gate insulating layer 32 may be formed entirely over the substrate 11. The second gate insulating layer 32 may be made of an inorganic insulating material, for example, silicon oxide ($SiO_2$) or silicon nitride ($SiN_X$).

A second semiconductor layer 22 as a semiconductor layer of the second sub-driving TFT DTr2 may be formed on the second gate insulating layer 32. The second semiconductor layer 22 may be made of polycrystalline silicon.

The second semiconductor layer 22 may include a second channel portion CH2 which is a portion of the second semiconductor layer 22 corresponding to the gate electrode 45 therebelow i.e., overlapping the gate electrode 45, and a second source portion S2 and a second drain portion D2 located at both sides of the second channel portion CH2.

The second source portion S2 and the second drain portion D2 are portions highly doped with impurities. For example, the second source portion S2 and the second drain portion D2 may be doped with a dopant having the same type (N type or P type) as a dopant of the first source portion S1 and the first drain portion D2. In a doping process of the second source portion S2 and the second drain portion D2, for example, a photoresist pattern may be used as a doping mask.

Since the gate electrode 45 is located below the second semiconductor layer 22, the gate electrode may serve as a bottom gate electrode for the second sub-driving TFT DTr2.

Further, a passivation layer 50 as an insulating layer may be formed on the second semiconductor layer 22. The passivation layer 50 may be made of an inorganic insulating material or organic insulating material. The passivation layer 50 may be formed to have a single-layered or multi-layered structure.

Referring to FIG. 5, in each pixel region P, a drain electrode 71 and a source electrode 73 may be formed on the passivation layer 50.

The drain electrode 71 may be connected to the first drain portion D1 of the first sub-driving TFT DTr1, and the source electrode 73 may be connected to the second source portion S2 of the second sub-driving TFT DTr2.

In this regard, since the first drain portion D1 of the first sub-driving TFT DTr1 may substantially serve as a drain portion of the driving TFT DTr, the drain electrode 71 may be formed to contact the first drain portion D1. Since the second source portion S2 of the second sub-driving TFT DTr2 may substantially serve as a source portion of the driving TFT DTr, the source electrode 73 may be formed to contact the second source portion S2.

In order to make a contact between the first drain portion D1 and the drain electrode 71, an insulating layer therebetween, for example, the passivation layer 50 and the first and second gate insulating layers 31 and 32 may have a first contact hole CT1 formed therein. Accordingly, the first drain portion D1 may contact the drain electrode 71 through the first contact hole CT1.

In order to make a contact between the second source portion S2 and the source electrode 73, an insulating layer therebetween, for example, the passivation layer 50 may have a second contact hole CT2 formed therein. Accordingly, the second source portion S2 may contact the source electrode 73 through the second contact hole CT2.

Further, the first and second sub-driving TFTs DTr1 and DTr2 may be electrically connected in series to each other through a connection electrode 75.

In this regard, the connection electrode 75 may be formed of the same metal material as and in the same process as the drain and source electrodes 71 and 73.

The connection electrode 75 may contact the first source portion S1 and the drain portion D2, which are located below the connection electrode 75, through a third contact hole CT3.

To do this, the third contact hole CT3 may be formed in the passivation layer 50 and the first and second gate insulating layers 31 and 32, and further formed in the second drain portion D2. In other words, the third contact hole CT3 may be formed to penetrate the second drain portion D2.

In this case, the connection electrode 75 may contact an inner surface of the second drain portion D2 (i.e., an inner surface exposed by (or surrounding or defining) the third contact hole CT3), and contact a top surface of the first source portion S1. Alternatively, the first source portion S1 may be formed to have the third contact hole CT3 therein similarly to the second drain portion D2, and in this case, the connection electrode 75 may contact an inner surface of the first source portion S1 exposed by the third contact hole CT3.

The first source portion S1 and the second drain portion D2, which overlap and are located below the connection electrode 75, may be electrically connected through the connection electrode 75, and thus the first and second sub-driving TFTs DTr1 and DTr2 (or the first and second semiconductor layers 21 and 22) may be connected in series.

As such, by using the connection electrode 75 made of a metal material, a stable electrical connection between the first and second sub-driving TFTs DTr1 and DTr2 can be made.

In this regard, a method of connecting the second drain portion D2 directly to the first source portion S1 through a contact hole without the connection electrode 75 might be considered. However, in this case, the second drain portion D2 has a great resistance because of its material characteristics, and thus a connection resistance between the first and second sub-driving TFTs DTr1 and DTr2 increases.

However, in this aspect, since the connection electrode 75 made of a metal material is used, a connection resistance between the first and second sub-driving TFTs DTr1 and DTr2 is reduced, and a stable electrical connection can be made.

As described above, the driving TFT DTr is configured in a vertically double-stacked structure that the first and second semiconductor layers 21 and 22 are arranged with the gate electrode 45 located on the first semiconductor layer 21 and below the second semiconductor layer 22. Accordingly, the double channel portions CH1 and CH2 overlapping each other in the vertical direction to the substrate 11 are formed, and thus a length of a channel can increase by at least two times compared with the prior art single-stacked structure using a single semiconductor.

In this aspect, the first and second semiconductor layers 21 and 22 may be formed to have a bent structure in a plan view, and the first and second channel portions CH1 and CH2 thereof may have a bent structure in a plan view. Accordingly, a length of a channel can be secured as much as possible in a limited area.

In this regard, referring to FIG. 3, in a plan view, the first semiconductor layer 21 may include a first part which extends in a first direction, for example, an x direction, and a second part which is bent from the first part and extends in a second direction, different from the first direction, for example, a −y direction.

As such, the first semiconductor layer 21 may be formed to have a bent structure in a plan view.

This bent structure may be applied similarly to the first channel portion CH1 of the first semiconductor layer 21. The first channel portion CH1 may include a first channel part CH1a which extends in the first direction as the x direction, and a second channel part CH1b which is bent from the first channel part CH1a and extends in the second direction as the −y direction.

Accordingly, the first channel portion CH1 may include a first channel length L1 as a length of a channel in the first direction defined by the first channel part CH1a, and a second channel length L2 as a length of a channel in the second direction defined by the second channel part CH1b. Thus, the first channel portion CH1 may have a channel length, L1+L2.

The second semiconductor layer 22 may include a third part which extends in the first direction as the x direction and overlaps the first part of the first semiconductor layer 21, and a fourth part which is bent from the third part and extends in a third direction, different from the first direction and the second direction, for example, a y direction (or +y direction).

As such, the second semiconductor layer 22 may be formed to have a bent structure in a plan view.

This bent structure may be applied similarly to the second channel portion CH2 of the second semiconductor layer 22. The second channel portion CH2 may include a third channel part CH2a which extends in the first direction as the x direction and overlaps the first channel part CH1a, and a fourth channel part CH2b which is bent from the third channel part CH2a and extends in the third direction as the +y direction.

The third channel part CH2a of the second channel portion CH2 may extend in the first direction that is the same direction as the first channel part CH1a of the first channel portion CH1, and may overlap the first channel part CH1a at the same length. Thus, the third channel part CH2a may have substantially the same channel length as the first channel part CH1a i.e., L1=L3.

Accordingly, the second channel portion CH2 may include the third channel length L3 as a length of a channel in the first direction defined by the third channel part CH2a, and a fourth channel length L4 as a length of a channel in the third direction defined by the fourth channel part CH2b. Thus, the second channel portion CH2 may have a channel length, L3+L4=L1+L4.

The first and second semiconductor layers 21 and 22 and their first and second channel portions CH1 and CH2 may have the bent structure, and the bent direction of the first channel portion CH1 and the bent direction of the second channel portion CH2 may be different, for example, opposite to each other.

Accordingly, a total channel length of the driving TFT DTr configured with the first and second sub-driving TFTs DTr1 and DTr2 vertically stacked may be a sum of L1+L2 which is a channel length of the first channel portion CH1 located at a lower layer, and L3 (=L1)+L4 which is a channel length of the second channel portion CH2 located at an upper layer, (L1+L2)+(L3+L4)=2L1+L2+L4.

As such, the first and second channel portions CH1 and CH2 are configured to be arranged in a vertically stacked structure with the gate electrode 45 therebetween and to have a bent structure in plane, and thus a channel length with respect to an occupied area can be maximized. Thus, a channel length of the driving TFT DTr to achieve a required driving property at a minimal area can be secured, and an area availability for the pixel region P can be improved.

Accordingly, even though a resolution increases, the driving TFT DTr securing a stable driving property can be provided effectively in a limited pixel region P.

Further, since the first channel portion CH1 and the second channel portion CH2 are configured to be bent and extend in the different directions (e.g., the −y direction and the +y direction, respectively), the channel lengths in the different directions can be adjusted individually, and thus the channel length of the first channel portion CH1 and the channel length of the second channel portion CH2 can be adjusted freely as required.

For example, the channel length, in the second direction as the −y direction, of the first channel portion CH1, and the channel length, in the third direction as the +y direction, of the second channel portion CH2 may be equal or different. In other words, the first and second sub-driving TFTs DTr1 and DTr2 may be formed in a symmetrical or unsymmetrical form.

The channel length of the first channel portion CH1 and the channel length of the second channel portion CH2 may be adjusted individually by making the first and second channel portions CH1 and CH2 bent in different directions. Accordingly, various driving properties respectively required for the first and second sub-driving TFTs DTr1 and DTr2 can be satisfied, and thus the driving TFT DTr suitable for a required property can be provided effectively.

Figure 6:
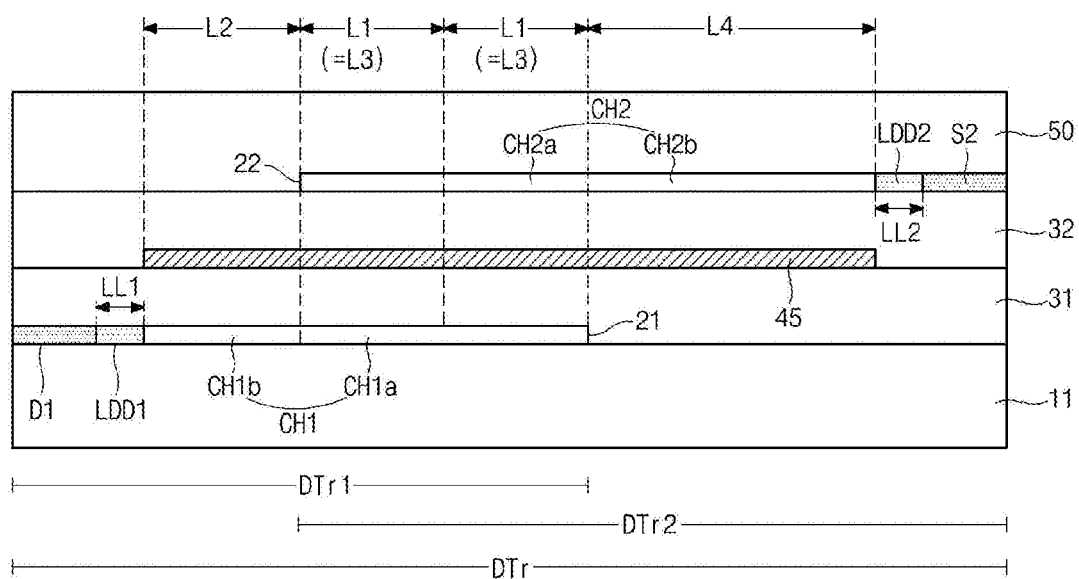
FIG. 6 is a cross-sectional view schematically illustrating a structure of a driving TFT in a pixel region according to a second aspect of the present disclosure.

FIG. 6 is a cross-sectional view schematically illustrating a structure of a driving TFT in a pixel region according to a second aspect of the present disclosure.

Detailed explanations of parts similar to those of the first aspect may be omitted.

Referring to FIG. 6, a driving TFT DTr of this aspect may be an N type TFT and use an LDD (lightly doped drain) TFT.

In this regard, a first semiconductor layer 21 of a first sub-driving TFT DTr1 may include a first lightly doped drain (LDD) portion LDD1 which is located between a first channel portion CH1 and a first source portion S1, and between the first channel portion CH1 and a first drain portion D1.

Similarly, a second semiconductor layer 22 of a second sub-driving TFT DTr2 may include a second LDD portion LDD2 which is located between a second channel portion CH2 and a second source portion S2, and between the second channel portion CH2 and a second drain portion D2.

By applying the LDD portions LDD1 and LDD2 to the driving TFT DTr having the vertically stacked structure and the bent structure, a reduction of a driving property caused by a short channel length can be further improved.

Further, in this aspect, sizes i.e., lengths of the first LDD portion LDD1 and the second LDD portions LDD2 may be adjusted individually. For example, a first length LL1 of the first LDD portion LDD1 and a second length LL2 of the second LDD portion LDD2 may be equal or different.

In particular, as the first channel portion CH1 and the second channel portion CH2 are bent in different directions (e.g., the −y direction and the +y direction, respectively), an end of the first channel portion CH1 and an end of the second channel portion CH2 are spaced apart from and separated from each other. In other words, an end, at a drain side, of the first channel portion CH1, and an end, at a source side, of the second channel portion CH2 are spaced apart from and separated from each other.

Accordingly, the first LDD portion LDD1, at the drain side, of the first channel portion CH1 is not substantially affected by a doping process for the second semiconductor layer 22 located over the first semiconductor layer 21. Thus, the first length LL1 of the first LDD portion LDD1 and the second length LL2 of the second LDD portion LDD2 may be adjusted individually.

Therefore, the optimal LDD portions respectively required for the first and second sub-driving TFTs DTr1 and DTr2 can be formed, and thus the driving TFT DTr suitable for a required property can be provided effectively.

Figure 7:
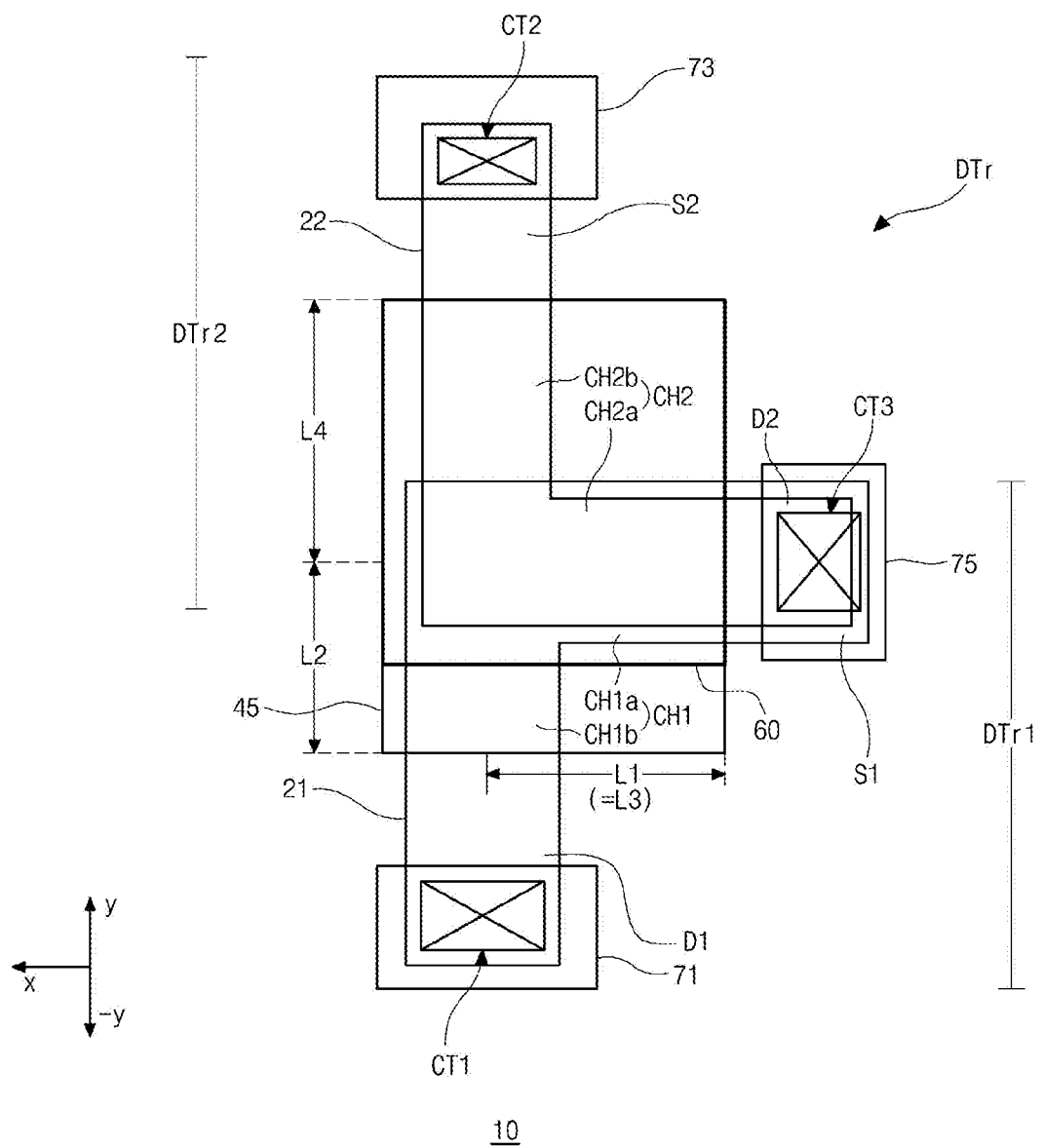
FIGS. 7 and 8 are a plan view and a cross sectional view, respectively, schematically illustrating a structure of a driving TFT in a pixel region according to a third aspect of the present disclosure.
Figure 8:
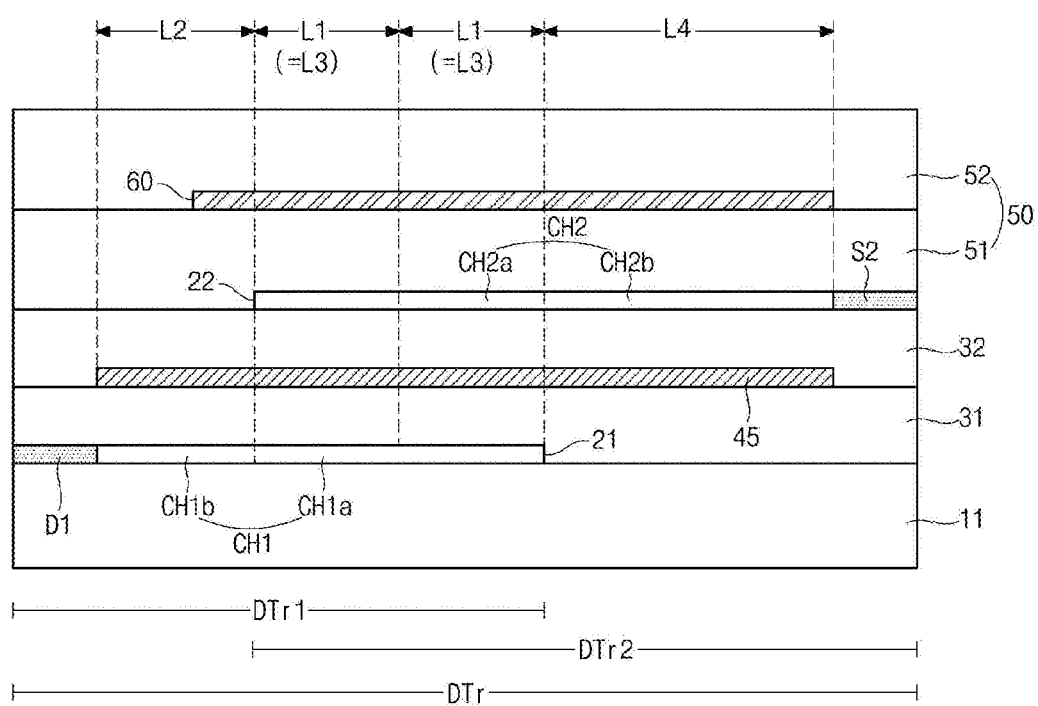

FIGS. 7 and 8 are a plan view and a cross sectional view, respectively, schematically illustrating a structure of a driving TFT in a pixel region according to a third aspect of the present disclosure.

Detailed explanations of parts similar to those of the first and second aspects may be omitted.

Referring to FIGS. 7 and 8, a driving TFT DTr of this aspect may include an electrode pattern 60 which is located on a second sub-driving TFT DTr2, and corresponds to and overlaps a second channel portion CH2 of the second sub-driving TFT DTr2.

For example, a first passivation layer 51 may be formed on a second semiconductor layer 22, and the electrode pattern 60 may be formed on the first passivation layer 51.

A second passivation layer 52 may be formed on the electrode pattern 60, and a drain electrode 71 and a source electrode 73 may be formed on the second passivation layer 52.

The electrode pattern 60 may be arranged to correspond to and overlap the second channel pattern CH2, and may serve as a doping mask in a doping process for a second source portion S2 and a second drain portion D2 of the second semiconductor layer 22.

The electrode pattern 60 may serve to block a light traveling toward the second channel portion CH2 from the outside over the electrode pattern 60. Further, the electrode pattern 60 may overlap at least part of the first channel portion CH1.

The electrode pattern 60 may serve as a back gate electrode. For example, the electrode pattern 60 may be supplied with an individual bias voltage from a power supply circuit, or may be electrically connected to the gate electrode 45. Alternatively, the electrode pattern 60 may be electrically connected to the source electrode 73. Alternatively, the electrode pattern 60 may be electrically connected to the drain electrode 71 so that the electrode pattern 60 serves as one electrode of a storage capacitor (Cst of FIG. 2) i.e., a storage electrode facing the gate electrode 45.

Figure 9:
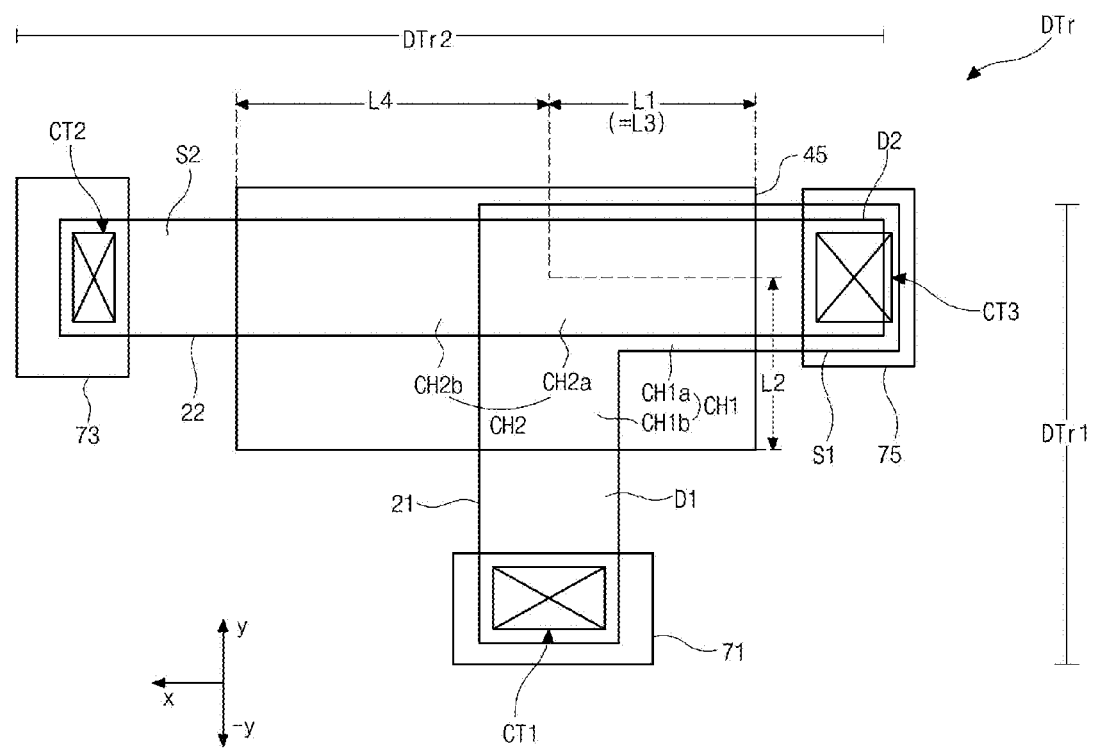
FIG. 9 is a plan view schematically illustrating a structure of a driving TFT in a pixel region according to a fourth aspect of the present disclosure.

FIG. 9 is a plan view schematically illustrating a structure of a driving TFT in a pixel region according to a fourth aspect of the present disclosure.

Detailed explanations of parts similar to those of the first to third aspects may be omitted.

Referring to FIG. 9, in a driving TFT DTr of this aspect, one of first and second sub-driving TFTs DTr1 and DTr2 may have a bent structure, and the other of first and second sub-driving TFTs DTr1 and DTr2 may have a non-bent structure i.e., a linear structure.

For the purpose of explanations, it is assumed that the first sub-driving TFT DTr1 has the bent structure, and the second sub-driving TFT DTr2 has the linear structure.

In this case, a second semiconductor layer 22 of the second sub-driving TFT DTr2 may include a third part that extends in a first direction as a x direction and overlaps the first semiconductor layer 21, and a fourth part that continuously extends (or further extends) from the third part in the first direction.

Accordingly, a second channel portion CH2 of the second semiconductor layer 22 may be formed to have the linear structure. In this regard, the second channel portion CH2 may include a third part CH2*a* that extends in a first direction as a x direction and overlaps a first channel portion CH1, and a fourth part CH2*b* that continuously extends from the third part CH2*a* in the first direction.

The third channel part CH2*a* of the second channel portion CH2 may extend in the first direction that is the same direction as a first channel part CH1*a* of the first channel portion CH1, and may overlap the first channel part CH1*a* at the same length. Thus, the third channel part CH2*a* may have substantially the same channel length as the first channel part CH1*a*.

The fourth channel part CH2*b* of the second channel portion CH2 extends continuously in the first direction that is different from an extension direction of a second channel part CH1*b* of the first channel portion CH1, and has a fourth channel length L4.

Thus, the second channel portion CH2 may have a channel length in the first direction, L3+L4=L1+L4.

The first semiconductor layer 21 and its first channel portion CH1 may have the bent structure in a plane view, and the second semiconductor layer 22 and its second channel portion CH2 may have the linear structure in a plane view.

The bent and linear hybrid structure of the fourth aspect, and the bent structure of the first aspect may be properly selected depending on arrangement of elements of the pixel region P and the like.

Even in the case of the bent and linear hybrid structure of the fourth aspect, a channel length with respect to an occupied area can increase. Thus, a channel length of the driving TFT DTr to achieve a required driving property at a minimal area can be secured, and an area availability for the pixel region P can be improved.

Further, like the first aspect, the first and second channel portions CH1 and CH2 may respectively have the channel parts that are the second channel part CH1*b* and the fourth channel part CH2*b* extending in different directions, and the channel length of the first channel portion CH1 and the channel length of the second channel portion CH2 may be adjusted individually. Accordingly, various driving properties respectively required for the first and second sub-driving TFTs DTr1 and DTr2 can be satisfied, and thus the driving TFT DTr suitable for a required property can be provided effectively.

According to the above aspects, the driving TFT is configured to have a vertically double-stacked structure sharing the gate electrode, and at least one channel portion of the driving TFT has a bent structure.

Accordingly, a channel length of the driving TFT with respect to an occupied area can increase. Therefore, a channel length of the driving TFT DTr to achieve a required driving property at a minimal area can be secured, and a stable driving property can be achieved. Further, an area availability for the pixel region can be improved.

Further, the two channel portions vertically stacked have the respective channel parts extending in different directions, and their channel lengths can be adjusted individually. Therefore, various driving properties respectively required for the two sub-driving TFTs can be satisfied, and thus the driving TFT suitable for a required property can be provided effectively.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A thin film transistor (TFT) substrate, comprising:
   a TFT located on a substrate and including a gate electrode, a first semiconductor layer and a second semiconductor layer,
   wherein the first semiconductor layer, the gate electrode and the second semiconductor layer vertically stacked, and the first and second semiconductor layers are made of polycrystalline silicon,
   wherein the first and second semiconductor layers are electrically connected to each other in series and respectively include first and second channel portions, and at least one of the first and second channel portions has a bent structure in a plan view,
   wherein the TFT further comprises:
      a first gate insulating layer between the first semiconductor layer and the gat electrode;
      a second gate insulating layer between the second semiconductor layer and the gate electrode and on the first gate insulating layer;
      a passivation layer on the second semiconductor layer; and
      a connection electrode on the passivation layer,
      wherein the connection electrode contacts one of a source portion and a drain portion of the second semiconductor layer and another one of a source portion and a drain portion of the first semiconductor layer through a contact hole in the passivation layer and the first and second gate insulating layers, and
      wherein a length of a connection path of the one of the source portion and the drain portion of the second semiconductor layer and the another one of the source portion and the drain portion of the first semiconductor layer is equal to a distance between the one of the source portion and the drain portion of the second semiconductor layer and the another one of the source portion and the drain portion of the first semiconductor layer.

2. The TFT substrate of claim 1, wherein the first channel portion includes a first channel part extending in a first direction, and a second channel part extending in a second direction different from the first direction,
   wherein the second channel portion includes a third channel part extending in the first direction and overlapping the first channel part, and a fourth channel part extending in a direction different from the second direction, and
   wherein the first and third channel parts have a same channel length.

3. The TFT substrate of claim 2, wherein the fourth channel part further extends in a third direction different from the first and second directions.

4. The TFT substrate of claim 2, wherein the fourth channel part further extends in the first direction from the first channel part.

5. The TFT substrate of claim 2, wherein the second and fourth channel parts have a same channel length or different channel lengths.

6. The TFT substrate of claim 1, wherein the one of the source and drain portions of the second semiconductor layer contacts the connection electrode at an inner surface surrounding the contact hole.

7. The TFT substrate of claim 1, wherein the first and second semiconductor layers respectively include first and second lightly doped drain (LDD) portions, and the first and second LDD portions have a same length or different lengths.

8. The TFT substrate of claim 1, further comprising an electrode pattern located on and corresponding to the second channel portion of the second semiconductor layer which is on the first semiconductor layer, and
  wherein the electrode pattern is connected to one of a source electrode, a drain electrode and the gate electrode of the TFT, or is supplied with a bias voltage from a power supply circuit.

9. The TFT substrate of claim 1, wherein the contact hole is formed through the second semiconductor layer and extends into a surface of the first semiconductor layer.

* * * * *